United States Patent [19]

Tazuke

[11] Patent Number: 5,099,502
[45] Date of Patent: Mar. 24, 1992

[54] SHIFT REGISTER FOR PRODUCING PULSES IN SEQUENCE

[75] Inventor: Toshikazu Tazuke, Tokyo, Japan
[73] Assignee: NEC Corporation, Tokyo, Japan
[21] Appl. No.: 530,267
[22] Filed: May 30, 1990
[30] Foreign Application Priority Data May 30, 1989 [JP] Japan .................................. 1-137099

[51] Int. Cl.⁵ ...................... G11C 19/00; H03K 21/10; H03K 23/44
[52] U.S. Cl. ........................................ 377/78; 377/75; 377/76
[58] Field of Search ......................... 377/79, 78, 75, 76

[56] References Cited

U.S. PATENT DOCUMENTS

| | | | |
|---|---|---|---|
| 3,862,440 | 1/1975 | Suzuki et al. | 377/79 |
| 4,495,628 | 1/1985 | Zasio | 377/79 |
| 4,703,200 | 10/1987 | Zangara | 377/79 |
| 4,843,254 | 6/1989 | Motegi et al. | 377/79 |

*Primary Examiner*—John S. Heyman
*Attorney, Agent, or Firm*—Helfgott & Karas

[57] ABSTRACT

Disclosed herewith is a shift register for shifting data in series in synchronism with a shift clock signal and is composed of a plurality of data-shift gages connected in cascade, each of which includes a shift-in terminal and a shift-out terminal, and each of which further includes a first transfer gate, a first data hold circuit, a second transfer gate and a second data hold circuit connected in this order between the shift-in and shift-out terminals. Further provided in each of the data-shift stages is a gate circuit, in particular a NOR gate, which responds to logic levels at selected ones of the respective circuit connection points and produces a pulse signal.

7 Claims, 5 Drawing Sheets

SHIFT REGISTER FOR PRODUCING PULSES IN SEQUENCE

BACKGROUND OF THE INVENTION

The present invention relates to a shift register for shifting a data therethrough in synchronism with a shift clock signal and, more particularly, to a shift register used for producing a plurality of continuous pulses in accordance with shifting a data therethrough in synchronism with a shift clock signal.

A shift register is composed of a plurality of a data-shift stages connected in cascade. Each of the data-shift stages temporarily holds a data supplied thereto from a preceding stage in synchronism with one of leading and trailing edges of an clock pulse signal. The data holding stage produces an output during adjacent two leading or trailing edges of the clock pulse signal. Thereafter, the data holding stage supplies its data to succeeding stage. Accordingly, the shift register shifts an input data supplied to the leading data-shift stage toward the last data-shift stage successively in synchronism with the shift clock signal.

Since the input data is successively shifted one stage by one stage in order, a plurality of pulses generating in sequence can be derived from the shift register by providing terminals on respective stages, each of which connects to the succeeding data-shift stage. These pulses thus derived can be used as drive pulses for driving transistors. An example is to drive transistors for sampling an analog signal such as video signal or audio signal in time sequence. Another is to drive transistors for designating a digit or a row to be displayed in a display panel.

However, since each of the data-shift stages derives the data in synchronism with the same leading or trailing edges of the shift clock signal, the trailing edge portion of the driving pulse generated from one data-shift stage may overlap with the leading edge portion of the driving pulse generated from the succeeding data-shift stage. For this reason, there may occur a time period during which two stages both generate drive pulses. This causes that the analog signal is not sampled accurately and two digits or rows of the display panel are simultaneously designated to be displayed.

SUMMARY OF THE INVENTION

Therefore, an object of the present invention is to provide an improved shift register for producing a plurality of pulses in sequence, especially for generating the plurality of pulses without overlapping any portions of consecutive pulses with each other.

A shift register according to the present invention comprises a plurality of data-shift stages connected in cascade, each of which includes a shift-in terminal, a shift-out terminal, first, second and third nodes, a first transfer gate connected between the shift-in terminal and the first node and opened during one logic level period of a shift clock signal, a first hold circuit connected between the first and second nodes to hold a level at the first node during the other logic level period of the shift clock signal, a second transfer gate connected between the second and third nodes and opened during the other logic level period of the shift clock signal, a second hold circuit connected between the third node and the shift-out terminal to hold a level at the third node during one logic level period of the shift clock signal, and a gate circuit coupled to selected ones of the shift-in and shift-out terminals and the first to third node and producing a pulse signal when logic levels at the selected ones are in a predetermined logic level state.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1:
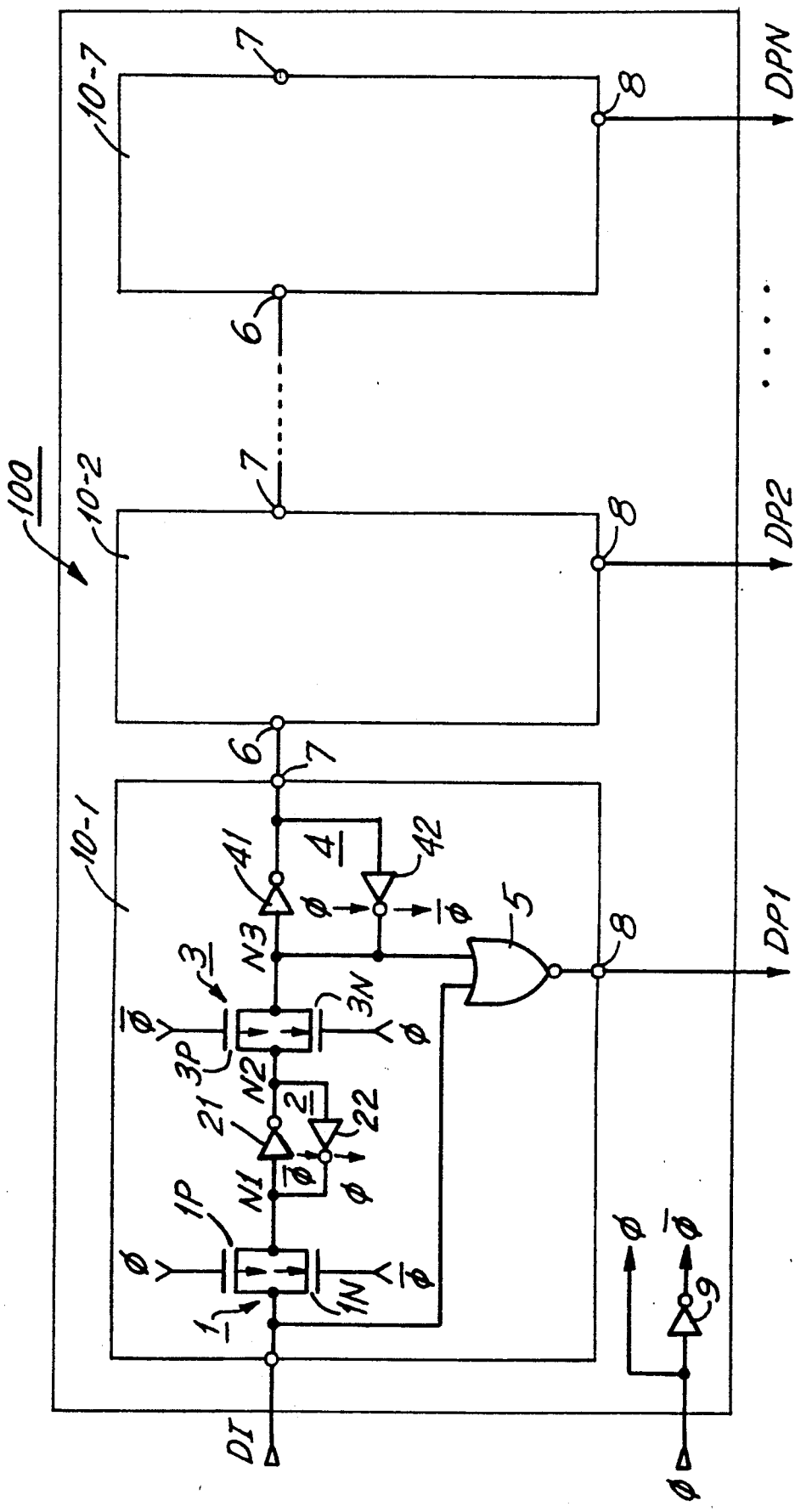
FIG. 1 is a circuit diagram representative of a shift register according to an embodiment of the present invention.

Referring to FIG. 1, a shift register 100 according to an embodiment of the present invention includes N pieces of data-shift stages 10-1, 10-2, . . . , 10-N each including a shift-in terminal 6 and a shift-out terminal 7. These data-shift stages 10-1 to 10-N are coupled in cascade in such a manner that the shift-out terminal 7 of the preceding data-shift stage, 10-1 for example, is connected to the shift-in terminal 6 of the succeeding data-shift stage, i.e. 10-2. However, the shift-in terminal 6 of the leading data-shift stage 10-1 is supplied with input data DI to be shifted. The shift register 100 is further supplied with a shift clock signal $\phi$. An inverter 9 inverts the phase of the shift clock signal $\phi$ to produce a complementary shift clock signal $\overline{100}$. These true and complementary shift clock signal $\phi$ and $\overline{\phi}$ are supplied in common to the data-shift stages 10-1 to 10-N.

Since each of the data-shift stages 10-1 to 10-N has the same circuit construction as one another, only the leading data-shift stage 10-1 is shown in detail in the drawing. Each of the data-shift stages 10-1 to 10-N includes a first transfer gate 1 connected between the shift-in terminal 6 and a first node N1, a first data hold circuit 2 connected between the first node N1 and a second node N2, a second transfer gate 3 connected between the second node N2 and a third node N3, and a second data hold circuit 4 connected between the third node N3 and the shift-out terminal 7. The first and second transfer gates 1 and 3 are composed of a pair of P-channel and N-channel MOS transistors 1P and 1N and 3P and 3N connected in parallel, respectively. The true shift clock signal $\phi$ is supplied to the gates of the transistors 1P and 3N and the complementary shift clock signal $\overline{\phi}$ is supplied to the gates of the transistor 1N and 3P. Therefore, the first and second transfer gates 1 and 3 are made open during the low level period and during the high level period of the shift clock signal $\phi$, respectively. The first and second data hold circuits 2 and 4 are composed of a pair of inverters 21 and 22 and 41 and 42, respectively, connected in such a manner that the input and output of one inverter 21 or 41 are connected respectively to the output and input of the other inverter 22 and 42. In particular, the inverters 22 and 42 are of a well-known clocked-type controlled by the shift clock signals $\phi$ and 100 . The clocked-inverter 22 thus operates during the high level period of the shift clock $\phi$, while the clocked-inverter 42 operates during the low level period thereof. Accordingly, the data hold circuit 2 outputs the inverted data of the data at the node N1 during the low level period of the shift clock signal $\phi$ and holds the inverted data during the high level period thereof. On the other hand, the data hold circuit 4 outputs the inverted data of the data at the node N3 during the high level period of the shift clock signal $\phi$ and holds the inverted data during the low level period thereof. Each of the data-shift stages 10-1 to 10-N further includes a drive pulse output terminal 8 and a NOR gate 5 in accordance with the present invention. The NOR gate 5 has a first input node connected to the shift-in terminal 6, a second input node connected to the node N3 and an output node connected to the drive pulse output terminal 8 from which a corresponding one of drive pulses DP1 to DPN is derived.

Figure 2:
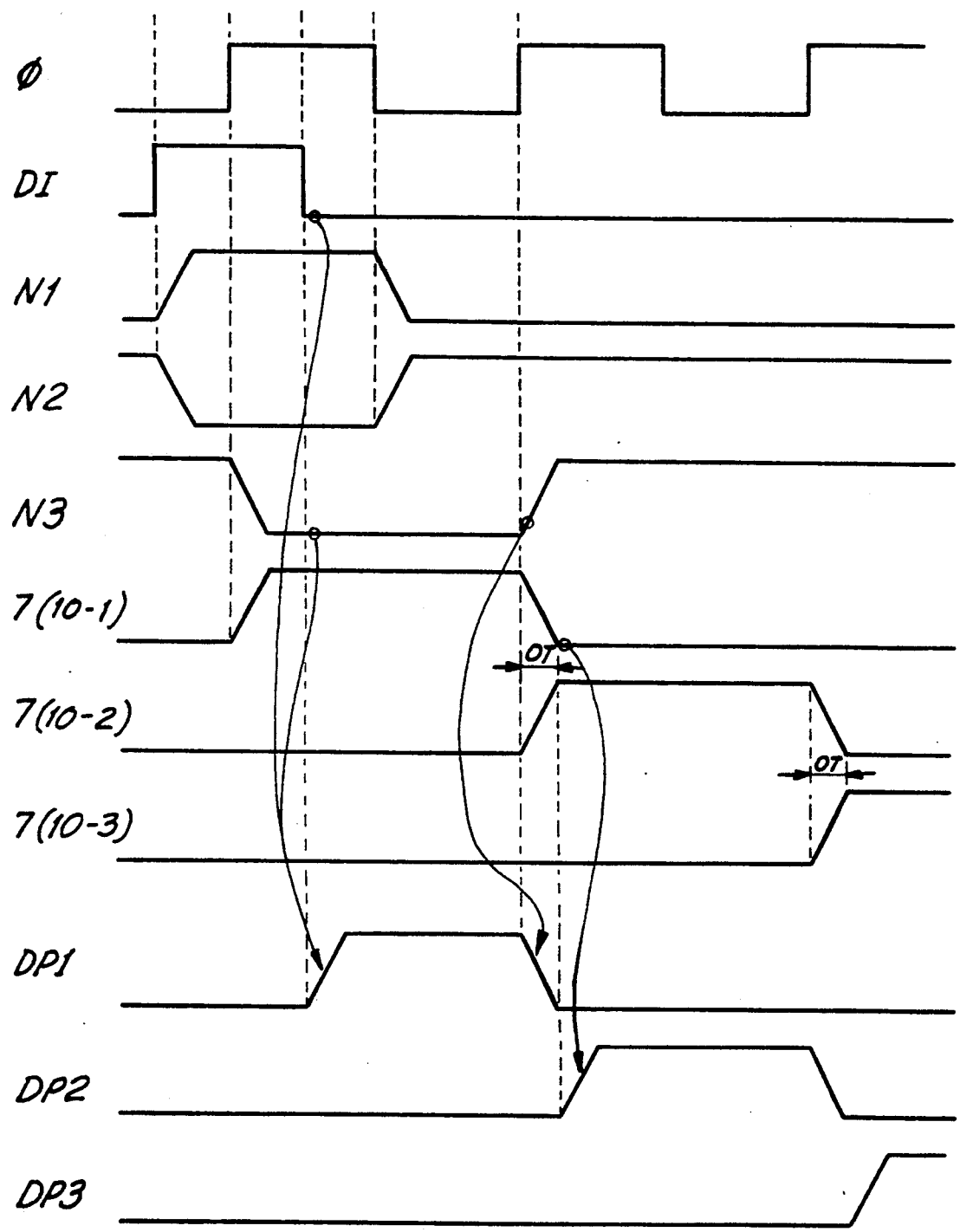
FIG. 2 is a timing chart representative of an operation of the shift register shown in FIG. 1.

In operation, assume that the input data DI of the high level is supplied to the shift-in terminal 6 of the leading data-shift stage 10-1 when the shift clock signal $\phi$ takes the low level, as shown in FIG. 2. At this time, the transfer gate 1 is in the open state and the clocked-inverter 22 is deactivated, so that the levels at the nodes N1 and N2 are changed to the high level and the low level, respectively, as shown in FIG. 2. Since the transfer gate 3 is closed and the inverter 42 operates, the node N3 and the shift-out terminal 7 hold the high level and the low level, respectively.

In response to the change of the shift clock $\phi$ to the high level, the transfer gate 1 is closed and the inverter 22 is activated. Therefore, the nodes N1 and N2 are maintained at the high level and the low level, respectively. On the other hand, the transfer gate 3 is made open and the inverter 42 is deactivated, so that the node N3 and the shift-out terminal 7 are changed to the low level and the high level, respectively.

When the trailing edge of the shift clock signal $\phi$ appears, since the input data D1 has been changed to the low level, the nodes N1 and N2 are changed to the low level and the high level, respectively. On the other hand, the transfer gate 3 is closed and the inverter 42 is activated, so that the node N3 and the shift-out terminal 7 hold the low level and the high level, respectively.

In response to a succeeding change of the shift clock signal $\phi$ to the high level, the node N3 and the shift-out terminal 7 change to the high level and low level, respectively. The respective levels at nodes N1, N2 and N3 and the shift-out terminal 7 are maintained until the next input data of the high level is supplied to the shift-in terminal 6.

Since the second data-shift stage 10-2 receives at the shift-in terminal thereof the shift-out data from the leading data-shift stage 10-1, the shift-out terminal 7 of the second data-shift stage 10-2 changes to the high level in response to the above succeeding change of the shift clock signal $\phi$ to the high level and then changes to the low level in response to a further succeeding change of the signal $\phi$ to the high level, as shown in FIG. 2. In response to this further succeeding change of the signal $\phi$ to the high level, the third data-shift stage 10-3 starts to change the shift-out terminal 7 thereof to the high level.

Thus, the input data DI of the high level is shifted from the leading data-shift stage 10-1 to the last data-shift stage 10-N in order in synchronism with the shift clock signal $\phi$. Since a sequence of pulses are derived from the shift-out terminals 7 of the data-shift stages 10-1 to 10-N, those pulses can be also used as drive pulses. However, as shown by "OT" in FIG. 2, the trailing edge portion of one shift-out pulse overlaps with the leading edge portion of the succeeding shift-out pulse.

In order to obtain a sequence of drive pulses in which each drive pulse is produced without overlapping with another pulse, the NOR gate receives the data signals at the shift-in terminal 6 and the node N3 and outputs the drive pulse DP to the terminal 8. When both the levels at the terminal 6 and the node N3 are at the low level, the drive pulse DP take the high level. When at least one of the levels at the terminal 6 and the node N3 is at the high level, the drive pulse DP takes the low level. As a result, the data-shift stages 10-1 to 10-N produce drive pulses DP1 to DPN in order without overlap of successive two pulses, as shown in FIG. 2.

Figure 5:
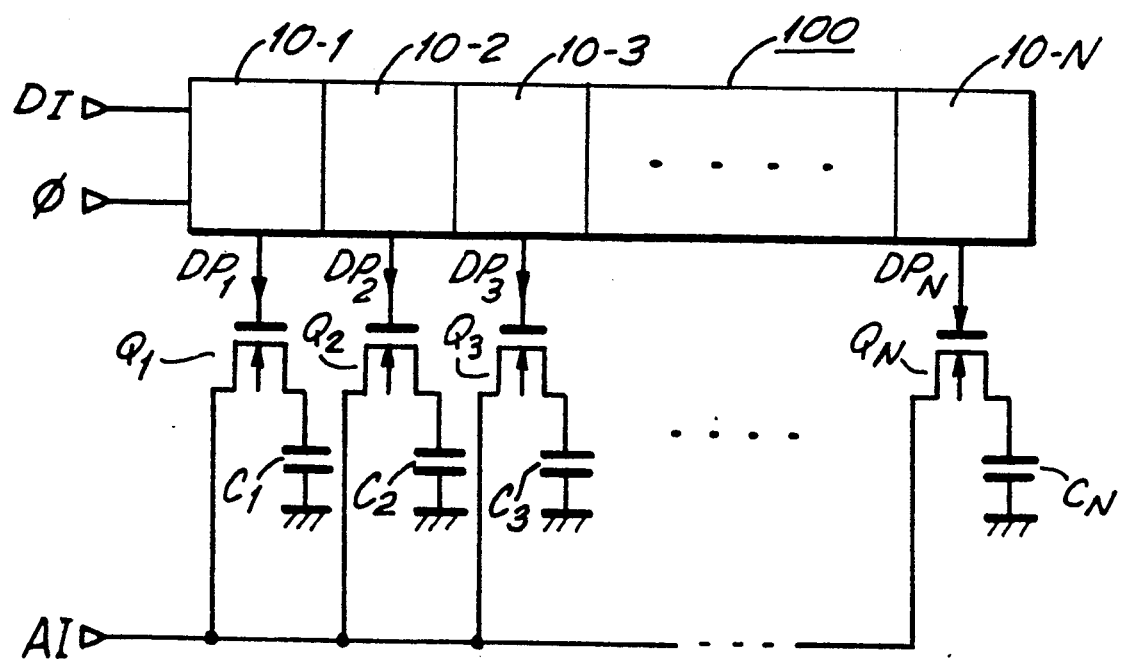
FIG. 5 is a circuit diagram representative of an application of the shift register according to the present invention.

Referring to FIG. 5, the shift register shown in FIG. 1 is applied to a signal sample and hold circuit. An analog signal AI including video information is supplied in common to the respective one ends of N-channel MOS transistors $Q_1$ to $Q_N$ which are in turn controlled by the drive pulses DP1 to DPN from the shift register 100, respectively. The other ends of the transistors $Q_1$ to $Q_N$ are connected to capacitors $C_1$ to $C_N$, respectively. When the transistor $Q_1$ is turned ON by the corresponding drive pulse DP1, the level of the signal AI is sampled and held by the capacitor $C_1$. The level of the signal AI is thus sampled and held in time sequence. Since two or more transistors Q are not turned ON simultaneously by the corresponding drive pulses DP from the shift register 100, the level of the signal AI is sampled precisely. If the shift-out pulses at the terminals 7 are used us the drive pulses DP, two transistors, $Q_1$ and $Q_2$ for example, are turned ON during the period TO shown in FIG. 2, so that the level of the signal AI is subjected to the capacitance-division by the capacitors $C_1$ and $C_2$, the precise level sampling operation being thereby performed.

Figure 3:
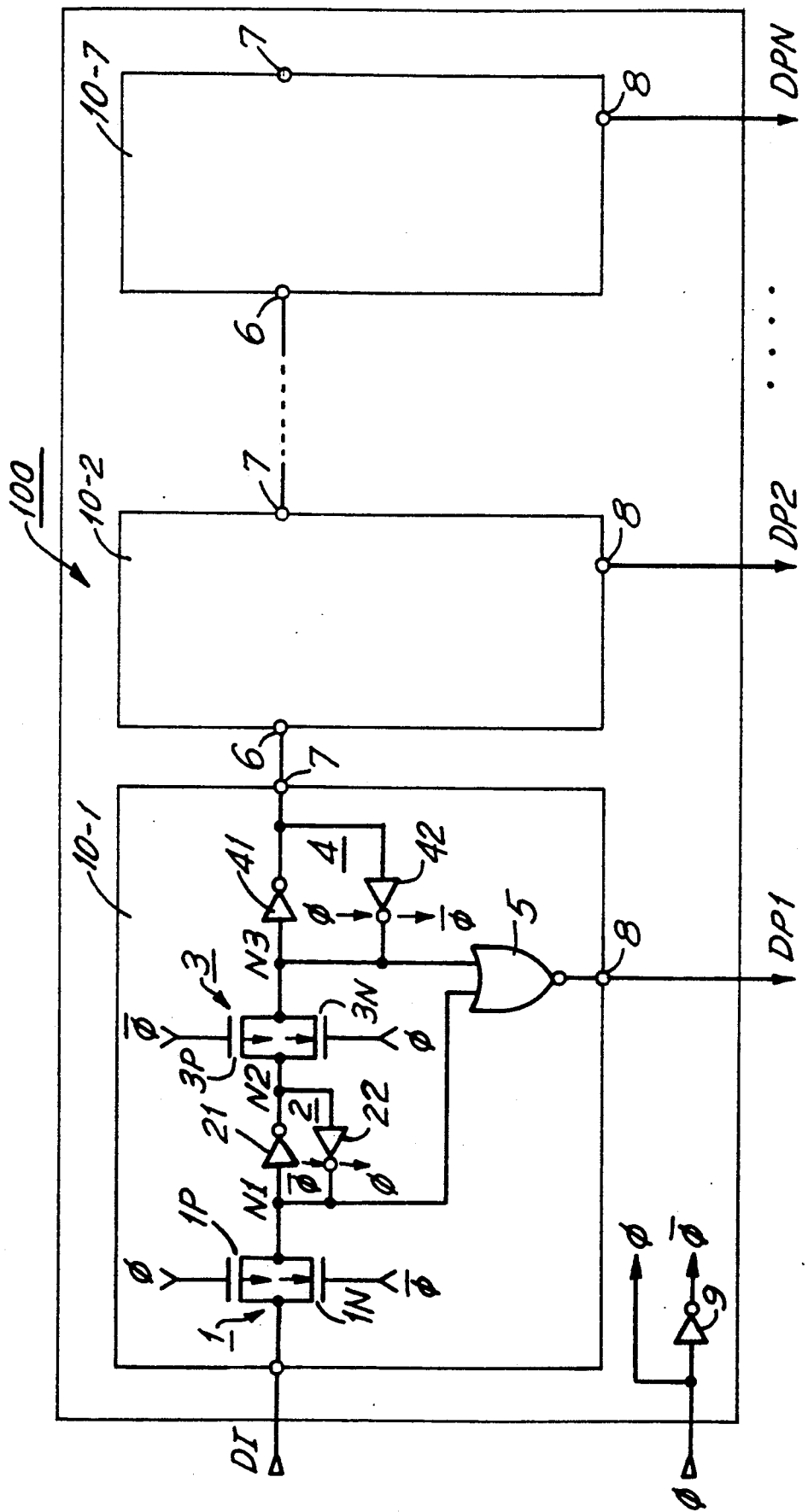
FIG. 3 is a circuit diagram representative of a shift register according to another embodiment of the present invention.
Figure 4:
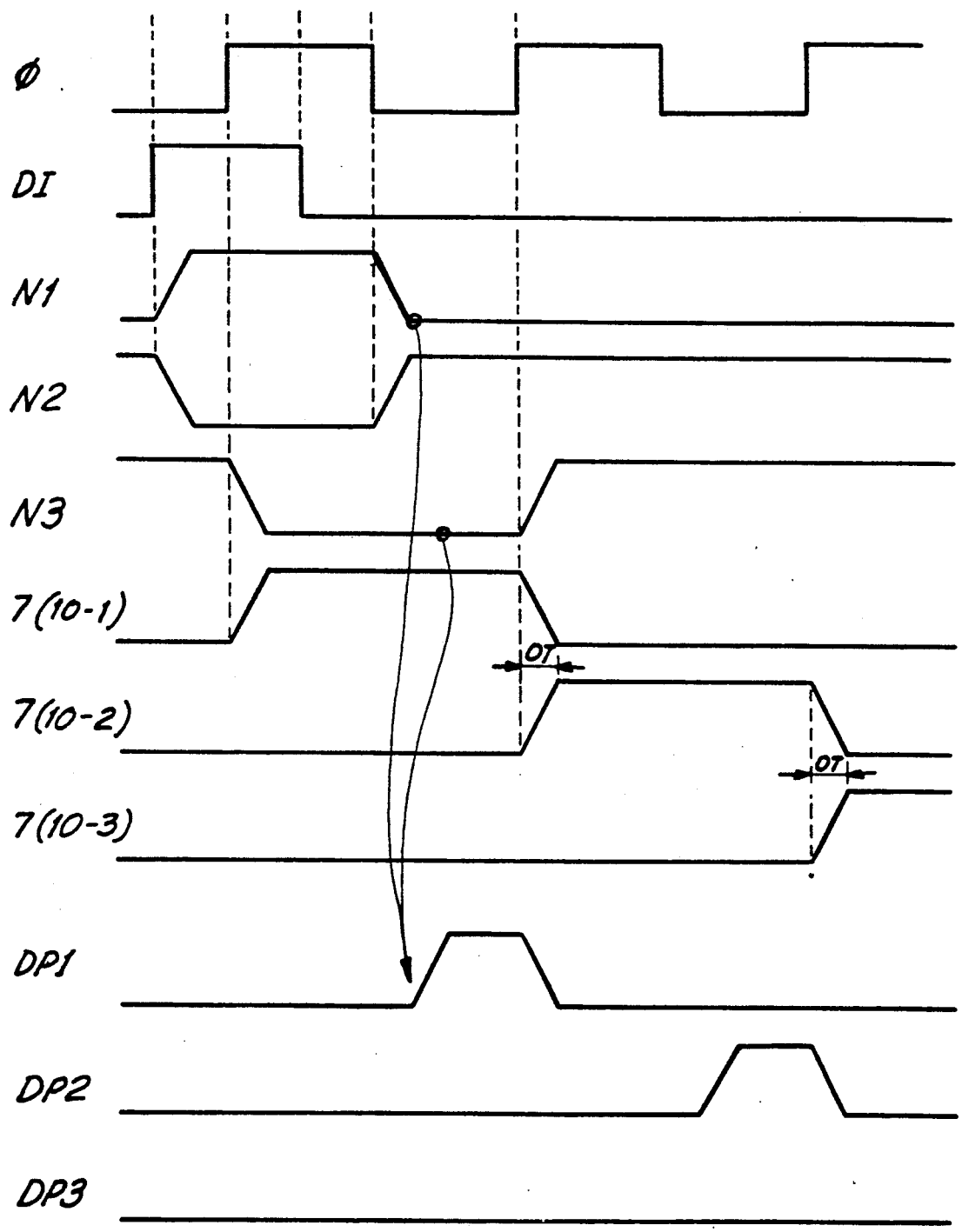
FIG. 4 is a timing chart representative of an operation of the shift register shown in FIG. 3.

Turning to FIG. 3, there is shown another embodiment of the present invention, in which the same constituents as those shown in FIG. 1 are denoted by the same reference numerals to omit the further description thereof. In this embodiment, the first input node of the NOR gate 5 is connected to the node N1. Therefore, a sequence of drive pulses DP1 to DPN are produced in accordance with the timing shown in FIG. 4. As apparent from this drawing, each of the drive pulses DP1 to DPN are completely separated from one another. Moreover, the pulse width of each drive pulse DP can be controlled by the low level period of the shift clock signal $\phi$.

It is apparent that the present invention is not limited to the above embodiments but may be modified and changed without departing from the scope and spirit of the invention. For example, in case of requiring low-active drive pulses DP1 to DPN, an OR gate is used in place of the NOR gate 5. In FIG. 3, the NOR gate 5 can be replaced by an AND or NAND gate inputted with data signals from the node N2 and the shift-out terminal 7.

What is claimed is:

1. A shift register comprising: a first and a second data-shift stages, each of which includes a shift-in terminal, a shift-out terminal, first, second and third nodes, a pulse signal-output-terminal, a first transfer gate connected between said shift-in terminal and said first node, said first transfer gate being supplied with a shift clock signal and being opened in accordance with a first logic level state of said shift clock signal, means for applying at said second node a signal which is inverted to a signal at said first node and for temporarily holding a level at said first node in accordance with a second logic level state opposite to said first logic level of said shift clock signal, a second transfer gate connected between said second and third nodes, said second transfer gate being supplied with said shift clock signal and being opened in accordance with said second logic level state of said shift clock signal, means for applying at said shift out-terminal a signal which is inverted to a signal at said third node and for temporarily holding a level at said third node in accordance with said first logic level state of said shift clock signal, and gate circuit means coupled to selected ones of said shift-in and shift-out terminals and said first to third nodes for producing a pulse signal in response to logic levels at said selected ones; means for connecting said shift-out terminal of said first data-shift stage to the shift-in terminal of said second data-shift stage; and means for supplying input data to said shift-in terminal of said first data-shift stage.

2. The shift register as claimed in claim 1, wherein said gate circuit means comprises a NOR gate circuit having a first input, a second input and an output, said first input of said NOR gate circuit being connected to one of said shift-in terminal and said first node, said second input of said NOR gate circuit being connected to said third node, said output of said NOR gate circuit being coupled to said pulse-signal-output terminal, said NOR gate producing a pulse signal in response to logic level agreement at said first input and said second input of said NOR gate circuit.

3. The shift register as claimed in claim 2, wherein said first input of said NOR gate circuit is coupled to said shift-in terminal.

4. The shift register as claimed in claim 2, wherein said first input of said NOR gate circuit is coupled to said first node.

5. A circuit comprising: a first and second data-shift stages, each of which includes a shift-in terminal, a shift-out terminal, first, second and third nodes, a pulse-signal output terminal, a first transfer gate connected between said shift-in terminal and said first node, said first transfer gate being supplied with a shift clock signal and being opened in accordance with a first logic level state of said shift clock signal, means for applying at said second node a signal which is inverted to a signal at said first node and for temporarily holding a level at said first node in accordance with a second logic level state opposite to said first logic level of said shift clock signal, a second transfer gate connected between said second and third nodes, said second transfer gate being supplied with said shift clock signal and being opened in accordance with said second logic level state of said shift clock signal, means for applying at said shift-out terminal a signal which is inverted to a signal at said third node and for temporarily holding a level at said third node in accordance with said first logic level state of said shift clock signal, a NOR gate circuit having a first input, a second input and an output, said first input of said NOR gate circuit being connected to one of said shift-in terminal and said first node, said second input of said NOR gate circuit being connected to said third node, said output of said NOR gate being coupled to said pulse-signal-output-terminal, said NOR gate circuit outputting a pulse signal in response to logic level agreement at said first and said second input of said NOR gate circuit; means for connecting said shift-out terminal of said first data-shift stage to said shift-in terminal of said second data shift state; means for supplying input data to the shift-in terminal of said first data-shift stage; an analog-signal-input terminal; a first and a second capacitor; and a first and a second transistor having a source-drain path and a gate, respectively, said source-drain path of said first transistor being coupled between said analog-signal-input terminal and said first capacitor, said gate of said first transistor being coupled to said pulse-signal-output terminal of said first data-shift stage, said source-drain path of said second transistor being coupled between said analog-signal-input terminal and said second capacitor, said gate of said second transistor being coupled to said pulse-signal-output terminal of said second data-shift stage.

6. The circuit as claimed in claim 5, wherein said first input of said NOR gate circuit is coupled to said shift-in terminal.

7. The circuit as claimed in claim 5, wherein said first input of said NOR gate circuit is coupled to said first node.

* * * * *